United States Patent
Kim et al.

(10) Patent No.: US 11,784,150 B2
(45) Date of Patent: *Oct. 10, 2023

(54) ROUNDED METAL TRACE CORNER FOR STRESS REDUCTION

(71) Applicant: Intel Corporation, Santa Clara, CA (US)

(72) Inventors: Dae-Woo Kim, Phoenix, AZ (US); Ajay Jain, Albuquerque, NM (US); Neha M. Patel, Chandler, AZ (US); Rodrick J. Hendricks, Rio Rancho, NM (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/825,739

(22) Filed: May 26, 2022

(65) Prior Publication Data

US 2022/0285306 A1 Sep. 8, 2022

Related U.S. Application Data

(63) Continuation of application No. 17/009,321, filed on Sep. 1, 2020, now Pat. No. 11,380,643, which is a
(Continued)

(51) Int. Cl.
*H01L 23/00* (2006.01)
*H01L 25/065* (2023.01)
*H01L 23/538* (2006.01)

(52) U.S. Cl.
CPC ............ *H01L 24/16* (2013.01); *H01L 23/538* (2013.01); *H01L 23/5383* (2013.01);
(Continued)

(58) Field of Classification Search
CPC .............................. H01L 24/16; H01L 23/538
See application file for complete search history.

(56) References Cited

U.S. PATENT DOCUMENTS

| | | |
|---|---|---|
| 7,402,901 B2 | 7/2008 | Hatano et al. |
| 8,008,764 B2 | 8/2011 | Joseph |

(Continued)

FOREIGN PATENT DOCUMENTS

| | | |
|---|---|---|
| CN | 1074557 | 7/1993 |
| CN | 1835229 A | 9/2006 |

(Continued)

OTHER PUBLICATIONS

International Search Report and Written Opinion for International Patent Application No. PCT/US2016/047216 dated May 15, 2017, 12 pgs.

(Continued)

*Primary Examiner* — Anthony Ho
(74) *Attorney, Agent, or Firm* — Schwabe, Williamson & Wyatt, P.C.

(57) ABSTRACT

An integrated circuit package is disclosed. The integrated circuit package comprises a first integrated circuit die and a second integrated circuit die. The integrated circuit package further includes a substrate, wherein both the first integrated circuit die and the second integrated circuit die are connected to the substrate. The substrate includes an interconnect bridge embedded within the substrate, wherein the interconnect bridge includes at least one metal trace component, wherein the metal trace component includes rounded corners on a bottom portion of the metal trace component.

20 Claims, 7 Drawing Sheets

Related U.S. Application Data continuation of application No. 16/320,680, filed as application No. PCT/US2016/047216 on Aug. 16, 2016, now Pat. No. 10,797,014.

(52) U.S. Cl.
CPC ........ *H01L 23/562* (2013.01); *H01L 25/0655* (2013.01); *H01L 2224/16227* (2013.01); *H01L 2224/16235* (2013.01); *H01L 2924/15192* (2013.01); *H01L 2924/3512* (2013.01)

(56) References Cited

U.S. PATENT DOCUMENTS

| | | | |
|---|---|---|---|
| 10,797,014 | B2 | 10/2020 | Kim |
| 11,380,643 | B2 * | 7/2022 | Kim ..................... H01L 23/538 |
| 2004/0253831 | A1 | 12/2004 | Sun |
| 2005/0090097 | A1 | 4/2005 | Zhang |
| 2006/0160354 | A1 | 7/2006 | Zhang |
| 2007/0184654 | A1 | 8/2007 | Akram |
| 2011/0012268 | A1 | 1/2011 | Ozaki et al. |
| 2014/0159228 | A1 | 6/2014 | Teh et al. |
| 2014/0353827 | A1 | 12/2014 | Liu et al. |
| 2015/0048515 | A1 | 2/2015 | Zhang et al. |
| 2015/0318191 | A1 | 11/2015 | Liu et al. |

FOREIGN PATENT DOCUMENTS

| | | |
|---|---|---|
| EP | 0541405 | 5/1993 |
| JP | H0536681 A | 2/1993 |
| JP | H10214915 A | 8/1998 |
| WO | WO 2018034654 | 2/2018 |

OTHER PUBLICATIONS

International Preliminary Report on Patentability for International Patent Application No. PCT/US2016/047216 dated Feb. 25, 2019, 11 pgs.
Office Action for Germany Patent Application No. 112016007586.3 dated Nov. 26, 2021, 6 pgs., no translation.
Notice of Allowance for Germany Patent Application No. 112016007586.3 dated Mar. 30, 2022, 5 pgs., no translation.
Office Action for Chinese Patent Application No. 201680089660.9 dated Nov. 1, 2022, 11 pgs., no translation.
Office Action for Korean Patent Application No. 2019-7007608 dated Oct. 25, 2022, 10 pgs., with English translation.
Notice of Allowance for Korean Patent Application No. 2019-7007608 dated Mar. 28, 2023, 4 pgs.
Office Action for Chinese Patent Application No. 201680089660.9 dated Mar. 25, 2023, 8 pgs.

* cited by examiner

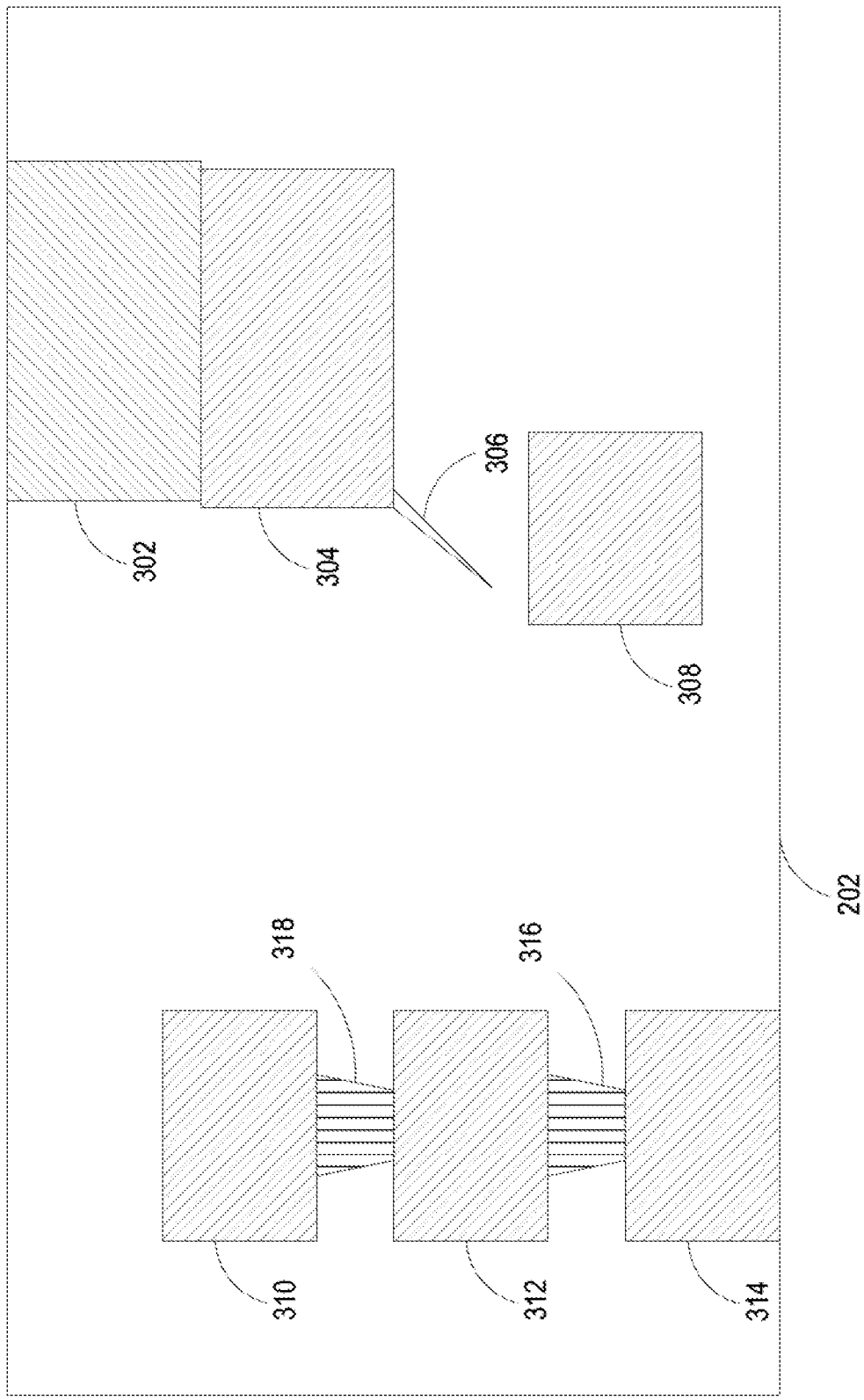

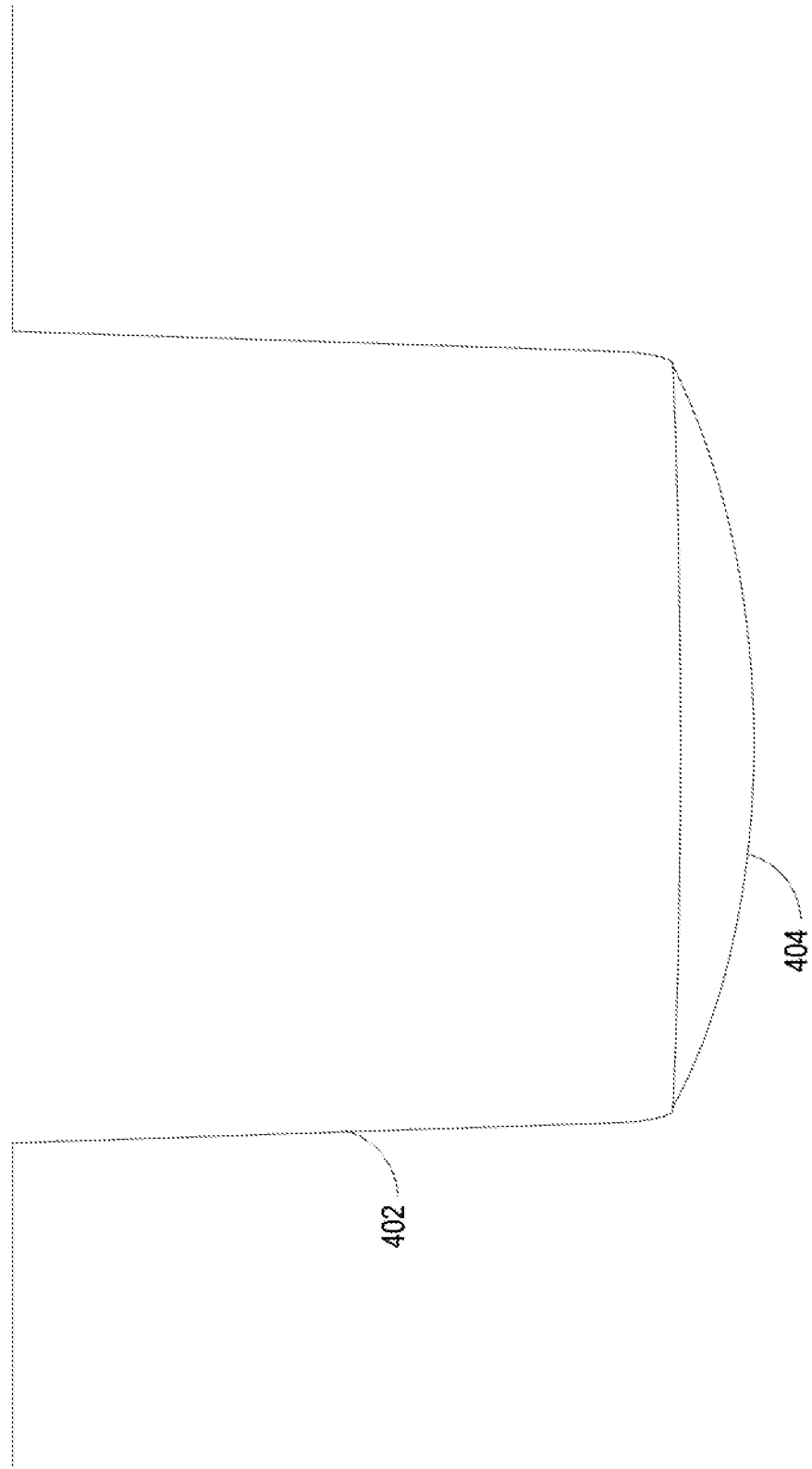

ROUNDED METAL TRACE CORNER FOR STRESS REDUCTION

CROSS-REFERENCE TO RELATED APPLICATIONS

This application is a continuation of U.S. patent application Ser. No. 17/009,321, filed Sep. 1, 2020, which is a continuation is U.S. patent application Ser. No. 16/320,680, filed Jan. 25, 2019, now U.S. Pat. No. 10,797,014, issued Oct. 6, 2020, which is a U.S. National Phase Application under 35 U.S.C. § 371 of International Application No. PCT/US2016/047216, filed Aug. 16, 2016, entitled "ROUNDED METAL TRACE CORNER FOR STRESS REDUCTION," which designates the United States of America, the entire disclosure of which are hereby incorporated by reference in their entirety and for all purposes.

TECHNICAL FIELD

Embodiments described herein generally relate to connection bridges.

BACKGROUND

Microelectronic devices such as IC (integrated circuit) packages are increasingly manufactured at smaller and smaller scales. The smaller scale of technologies result in little tolerance for error and a need for better ways to interconnect these chips. However, current technologies for die connection either use on-package connection or through silicon via technology to connects these dies. Through silicon via technology is very high cost and it is not suitable for central processing units because these units produce a great deal of heat. On-package connection technology is such that line width and space on package technology does not allow high density input/output connections that run at the speed needed by current and future microelectronic devices.

BRIEF DESCRIPTION OF THE DRAWINGS

FIG. 3 shows a representation of a cross-section of an interconnect bridge made with rectangular shaped communication channels in some example embodiments.

FIG. 4 is a diagram showing a cross section of a groove etched into a silicon based interconnect bridge in some example embodiments.

DESCRIPTION OF EMBODIMENTS

Figure 1:
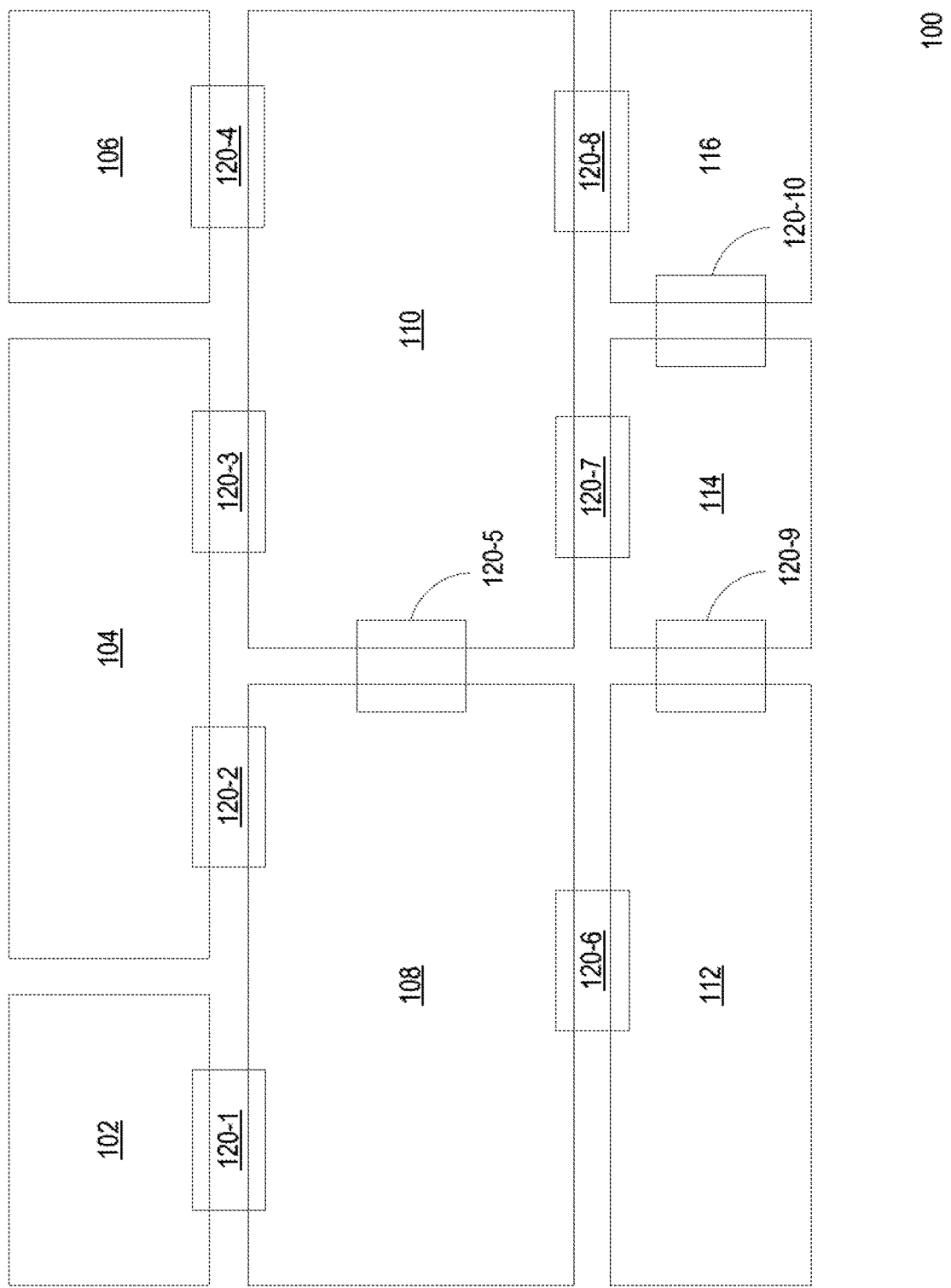
FIG. 1 shows a representation of an example embodiment of a multi-die IC package using silicon technology.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In some example embodiments, it would be beneficial to connect dies in a way that allows for high input/output signal density without being to expensive to reasonably manufacture One such method is an embedded interconnect bridge. In some example embodiments, an interconnect bridge is embedded in a substrate and electrically and communicatively connects two or more dies.

The embedded interconnect bridge is a silicon component that is embedded into the substrate at the time that the substrate is manufactured. Each embedded interconnect bridge includes one or more metal traces that connect and allow rapid communication between two different chips/dies. Each die is connected to the substrate, and through a via in the substrate, to the embedded interconnect bridge.

In order to reduce package sizes, ultra-thin interconnect bridges (e.g., less than less than 50 μm) are created. With ultra-thin interconnect bridges, the tolerance for cracks or errors is extremely reduced. Specifically, when metal traces are added to the interconnect bridges to allow communication and power supply, reducing the potential for cracks is a pre-eminent concern.

During the manufacturing stage, silicon is removed from a silicon wafer through plasma etching. Plasma etching uses pressure and gas to remove silicon based on a resist pattern. Removing silicon results in one or more grooves that are etched into the silicon (e.g., silicon dioxide).

Due to this process, when the plasma etching removes material from the substrate vertically, the grooves generally have a rectangular shaped profile. That is, if you were to cut an interconnect bridge in half and view the groove from the side (e.g., see FIG. 3 below), the profile would be rectangular.

However, the sharp metal corners of the rectangles act as a weakness point. Cracks can form in the substrate as the bridge goes through a series of heating and cooling processes and testing processes. These cracks almost always begin at the corners of grooves. When cracks form, the metal traces that have been deposited in the grooves can migrate to adjacent metal trace due to potential difference. Long cracks can create electrical connections where none should exist (e.g., between two separate communication signal lines) or create a short (e.g., connected a signal line to the ground), thereby rendering the chip inoperable. Furthermore, the cracks, even if they do not cause the interconnect bridge to electrically fail, can introduce structural weaknesses that cause the interconnect bridge to physically fail.

As such, when dealing with ultra-thin interconnect bridges (around 50 μm) it is important to eliminate the sharp corners from the grooves that are etched and into which trace metal is placed to facilitate communication and power system operation.

To avoid these sharp corners, after a resist pattern is placed on a substrate, the pressure and gas composition of the plasma-etching processes are controlled tightly to ensure that the bottom of any grooves created is rounded (e.g., semicircular) rather than rectangular. In this way, sharp corners in the grooves that hold the metal trace components are eliminated.

In some example embodiments, controlling the pressure level includes increasing the pressure by 40%. In some example embodiments, controlling the gas composition during the plasma etching process includes reducing the long chain fluorocarbons by 80%.

In some example embodiments, controlling the gas composition during the plasma etching process includes adding short chain fluorocarbons into the gas composition.

In some example embodiments, controlling the gas composition during the plasma etching process includes reducing the oxygen component of the gas composition by 20%.

In some example embodiments, controlling the gas composition during the plasma etching process includes reducing inert carrier gases by 50%.

FIG. 1 shows a representation of an example embodiment of a multi-die IC package 100 using silicon technology. In this example embodiment, there are a plurality of dies (102-116). There is no requirement that each die 102-116 be the same size. In addition, the dies 102-116 themselves are not required to be included in the same manufactured silicon layer as in past multi-die packages.

Instead, each die 102-116 in the multi-die package 100 can be connected to at least one other die 102-116 via one or more embedded interconnect bridges 120-1 to 120-10 that enable communication between two dies. The embedded interconnect bridges 120-1 to 120-10 are embedded in a substrate. The one or more dies 102-116 are then connected (both physically and electronically) to the embedded interconnect bridges 120-1 to 120-10 as needed to enable communication between different dies. In some example embodiments, the interconnect bridges 120-1 to 120-10 are embedded multi-die interconnect bridges (EMIBs).

In this way, the size and complexity of a multi-die IC package is not limited based on the size of silicon wafer that can be produced. Furthermore, each die can differ in capabilities or purpose (e.g., memory, processors, and so on).

Figure 2:
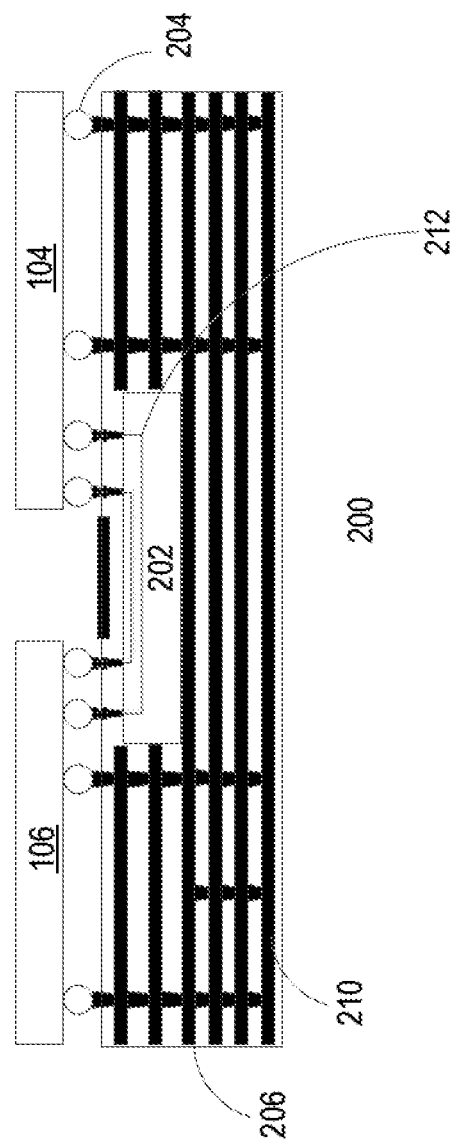
FIG. 2 shows a representation of a cross-section of a multi-die IC package with an interconnect bridge embedded in the substrate in some example embodiments.

FIG. 2 shows a representation of a cross-section of a multi-die IC package 200 with an interconnect bridge embedded in the substrate in some example embodiments. In this example, two dies (106 and 104) are connected via an interconnect bridge 202 that is embedded in a substrate 206 layer.

In some example embodiments, the interconnect bridge 202 is composed of silicon and includes one or more communication lines 212.

In some example embodiments, each die 104, 106 is connected to both the interconnect bridge 202 and the substrate 206 layer with one or more physical and electrical connections 204. For example, solder can be used to create a physical connection between the dies (104 to 106) and the interconnect bridge 202 and the substrate 206.

The substrate 206 includes one or more power supply lines 210 that connect to the one or more dies 104, 106 and provide needed power. In some example embodiments, the power supply lines 210 are composed of a conductive material (such as copper) and laid into the substrate 206 during the substrate manufacturing process.

In some example embodiments, the embedded interconnect bridge 202 is composed of silicon with conductive communication lines 212 laid within. The conductive communication lines 212 are metal traces that are created in the interconnect bridge through the process of plasma etching. In this case, each metal trace is laid into a groove. As noted above, each groove is etched using a specifically designed pressure and gas mix to ensure that the bottom of the groove (and thus the bottom of the metal trace communication lines are rounded, rather than flat with sharp edges).

In some example embodiments, the process for creating the interconnect bridge 202 is much simpler and cheaper than creating an IC die because the complexity of the embedded interconnect bridge 202 is much less than that of a processor or memory component.

FIG. 3 shows a representation of a cross-section of an interconnect bridge 202 made with rectangular shaped communication channels in some example embodiments. In this example, the interconnect bridge 206 includes metal trace communication channels 304 and 308 that allow communications through the bridge.

In some example embodiments, the interconnect bridge 206 further includes a top via 302 which connects at least one communication channel 304 to a component (e.g., an active or passive component) attached to the substrate in which the interconnect bridge 206 is embedded.

In some example embodiments, the interconnect bridge 206 is ultra-thin (e.g., around 50 µm). The interconnect bridge 206 further includes one or more power channels 310, 312, and 314. In some example embodiments, the power channels connect to each other (or to ground) through one or more vias 316 and 318.

In some example embodiments, the channels 304 and 308 are created with conductive material and are placed in the silicon of the interconnect bridge 206 during the fabrication of said interconnect bridge 206. Specifically, during the fabrication process, plasma etching is used to remove substrate and leave a groove into which metal trace is deposited.

In this example, the trace metals are deposited into grooves that have a rectangular cross section. In this example, the interconnect bridge 206 developed a crack during the process of heating and cooling or the testing process. The crack 306 originated at the sharp corner of the rectangular metal trace 304.

In some example embodiments, the crack 306 resulted from a point of weakness in the substrate caused by the sharp corners of the metal trace. Cracks, such as the one represented in this figure, can cause the interconnect bridge 206 to fail either physically or electronically (when one metal trace connects electrically with another component.)

FIG. 4 is a diagram showing a cross section of a groove 402 carved into a silicon based interconnect bridge. In this example, in contrast to the example in FIG. 3, the bottom of the metal trace groove is rounded 404 rather than flat.

As can be seen, with a rounded 404 bottom, the channel or groove avoids having any sharp edges that can act as a weak point for failure or cracking.

Thus, removing the sharp metal corner results in a higher silicon-based bridge yield (e.g., more useable interconnect bridges per area of silicon) and improves the reliability of the interconnect bridges that are produced.

Figure 5A:
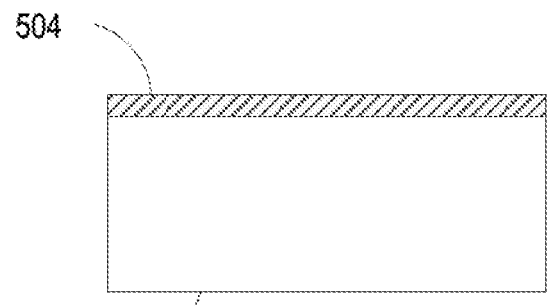
FIGS. 5A-5C show a basic representation of the method used to plasma-etch rounded bottom metal trace grooves in a silicon interconnect bridge 502.
Figure 5B:
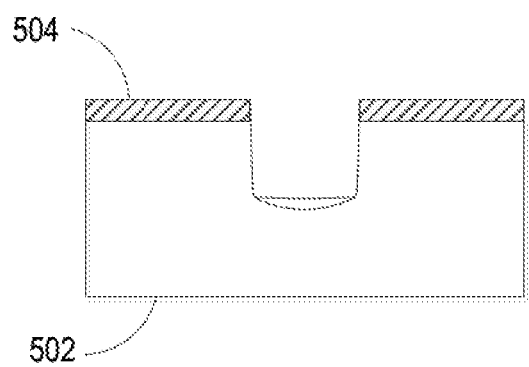
Figure 5C:
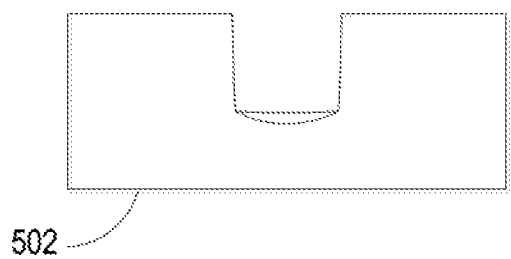

FIGS. 5A-5C show a basic representation of the method used to plasma-etch rounded bottom metal trace grooves in a silicon base layer 502 of an interconnect bridge FIG. 5A specifically shows a silicon base layer 502 with a resist layer 504 already applied. In some example embodiments, the resist layer is a photoresist layer that is added as a liquid so it is spread around evenly. In other example embodiments, the resist is added as a mask, allowing a specific pattern to be etched in the surface of the silicon interconnect bridge 502.

FIG. 5B shows the silicon layer 502 with the resist layer 504 after a plasma etching stage has completed. In some example embodiments, the plasma etching includes a high speed stream of plasma of a particular gas being shot at the interconnect bridge 502.

In some example embodiments, the high speed stream of plasma is delivered in pulses. The pressure under which the etching takes place helps determine the outcome of the etching.

In some example embodiments, the plasma interacts with the material out of which the interconnect bridge is formed (e.g., silicon dioxide) and removes that material where there is no resist material. Thus, the resist mask shapes the trace paths where metal can be laid to form communication channels in the interconnect bridge.

In order to ensure that the grooves or channels have a round bottom rather than a rectangular bottom, alterations are made to the regular plasma etching process.

In some example embodiments, the pressure used during the etching process is increased by up to 40%. This increased pressure results in increased gas resistance time and allows for reduced directionality of activated species.

In some example embodiments, the gas composition includes fluoride based gases. For example, the gas mixture includes long chain fluorocarbons. When sharp corners are desirable, the long chain fluorocarbons are the main etchant. However, to achieve a rounded bottom on metal trace channels, the long chain fluorocarbons are reduced by up to 80% to reduce the sidewall polymer deposition.

In some example embodiments, to further improve the roundedness of the metal trace bottom, a high flow of short fluorocarbons is added to the gas mixture to provide a high concentration of fluorine ions/radicals.

In some example embodiments, the oxygen (e.g. $O_2$) is reduced by 25% to manage a sidewall polymer deposition rate. In some example embodiments, this is balanced with the reduction in long chain fluorocarbons.

In some example embodiments, the inert carrier gases are reduced by 50% or more to reduce directionality of activated species travel. By making these changes to the normal plasma etching process, the etching process allows for the more rounded bottom as seen in FIG. 5B.

FIG. 5C shows the interconnect bridge after the resist layer has been removed. In this case, the interconnect bridge is ready for additional processing steps, including but not limited to a metal trace layer.

Figure 6:
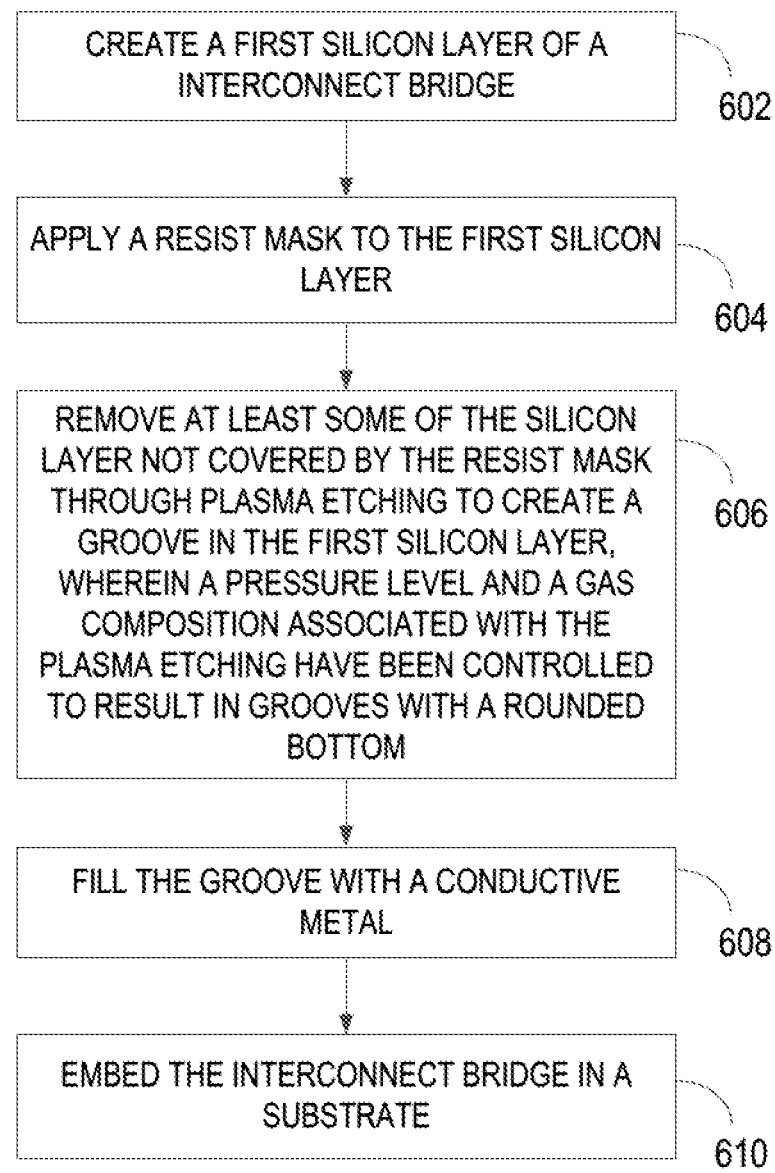
FIG. 6 shows a flow diagram of a method of creating an embedded interconnect bridge, in accordance with some example embodiments.

FIG. 6 shows a flow diagram of a method of creating an embedded interconnect bridge, in accordance with some example embodiments.

In some example embodiments, a first silicon layer of a interconnect bridge is created (602). In some example embodiments, the silicon layer is composed of silicon dioxide. In some example embodiments, the silicon layer is part of a silicon wafer.

In some example embodiments, a resist mask is applied to the first silicon layer (606). In some example embodiments, the resist is a material that protects the underlying silicon from the plasma etching process.

In some example embodiments, the interconnect bridge is ultra-thin. In some example embodiments, the average wafer is 200 μm to 300 μm thick. Any silicon layer (e.g., a wafer) thinner than 100 μm is very thin. In some example embodiments, the interconnect bridge is less than 40 μm.

In some example embodiments, as part of the manufacturing process, part of the first silicon layer is removed (606). For example, at least some of the silicon layer not covered by the resist mask through plasma etching is removed to create a groove in the first silicon layer, wherein a pressure level and a gas composition associated with the plasma etching have been controlled to result in grooves with a rounded bottom.

In some example embodiments, controlling the pressure level includes increasing the pressure by 40%. In some example embodiments, controlling the gas composition during the plasma etching process includes reducing the long chain fluorocarbons by 80%.

In some example embodiments, controlling the gas composition during the plasma etching process includes adding short chain fluorocarbons into the gas composition.

In some example embodiments, controlling the gas composition during the plasma etching process includes reducing the oxygen component of the gas composition by 20%.

In some example embodiments, the rounded corners of the metal trace component reduce the likelihood of cracks in the interlayer dielectric (ILD).

In some example embodiments, controlling the gas composition during the plasma etching process includes reducing inert carrier gases by 50%.

In some example embodiments, the etched grooves are filled (608) with a conductive metal. In some example embodiments, the interconnect bridge is embedded (610) in a substrate. In some example embodiments, the substrate is then connected to a first and second die. The interconnect bridge then allows communication between the first and second die.

Figure 7:
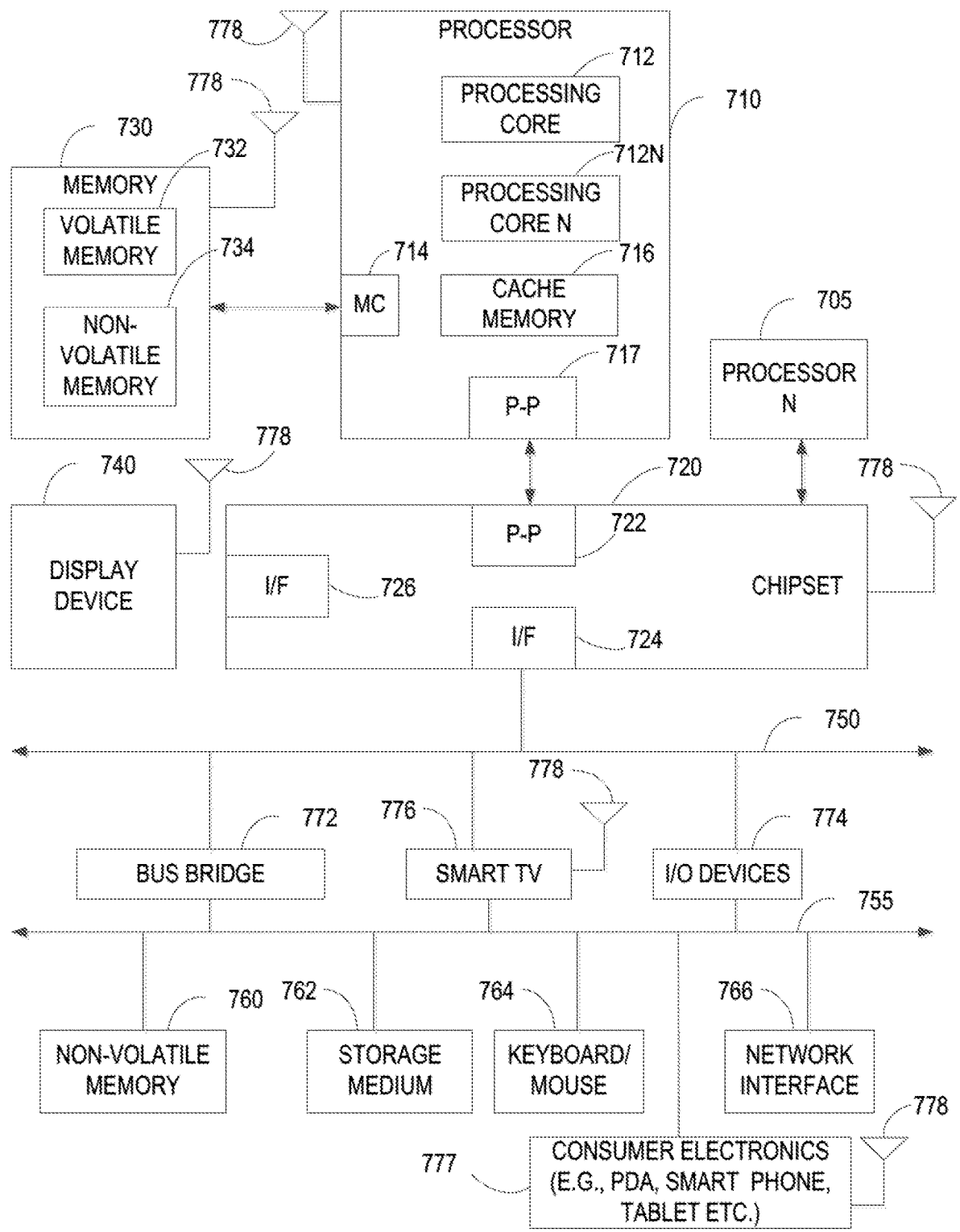
FIG. 7 is block diagram of an electronic system, in accordance with some example embodiments.

FIG. 7 illustrates a system level diagram, according to one example embodiment. For instance, FIG. 7 depicts an example of an electronic device (e.g., system) including a multi-die IC package with an interconnect bridge embedded in the substrate 102 as described in the present disclosure. FIG. 7 is included to show an example of a higher level device application. In one embodiment, system includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions, and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices 772, 776, 774, 760, 762, 764, 766, 777, and so forth. Chipset 720 may also be coupled to a wireless antenna 778 to communicate with any device configured to transmit and/or receive wireless signals.

Chipset 720 connects to display device 740 via interface 726. Display device 740 may be, for example, a liquid crystal display (LCD), a plasma display, cathode ray tube (CRT) display, or any other form of visual display device. In some embodiments, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, mass storage device(s) 762, keyboard/mouse 764, and network interface 766 via interface 724 and/or 704, smart television 776, consumer electronics 777, and so forth.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HPAV, UWB, Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

To better illustrate the method and apparatuses disclosed herein, a non-limiting list of embodiments is provided here:

Example 1 includes an integrated circuit package, comprising a first integrated circuit die; a second integrated circuit die; a substrate, wherein both the first integrated circuit die and the second integrated circuit die are connected to the substrate; and an interconnect bridge embedded within the substrate, wherein the interconnect bridge includes at least one metal trace component, wherein the metal trace component includes rounded corners on a bottom portion of the metal trace component.

Example 2 includes the integrated circuit package of example 1, wherein the first integrated circuit die is connected to the substrate through a surface mount technology.

Example 3 includes the integrated circuit package of any of examples 1-2, wherein the first integrated circuit die is connected to the substrate through a ball-grid array.

Example 4 includes the integrated circuit package of any of examples 1-3, wherein the interconnect bridge allows communication between the first integrated circuit die and the second integrated circuit die.

Example 5 includes the integrated circuit package of any of examples 1-4, wherein the interconnect bridge is less than 100 μm thick.

Example 6 includes the integrated circuit package of any of examples 1-5, wherein the interconnect bridge is less than 40 μm.

Example 7 includes an interconnect bridge, comprising: one or more communication vias enabled to connect the interconnect bridge to external electrical devices; one or more power delivery components connected to a source of power; a metal trace communication component, wherein the bottom of the metal trace communication component has curved corners; and wherein the interconnect bridge is embedded in an organic substrate.

Example 8 includes the interconnect bridge of example 7, wherein the interconnect bridge communicatively connects a first integrated circuit die to a second integrated circuit die.

Example 9 includes the interconnect bridge of any of examples 7-8, wherein the first integrated circuit die is connected to the organic substrate through a surface mount technology.

Example 10 includes the interconnect bridge of example 9, wherein the first integrated circuit die is connected to the organic substrate though a ball-grid array.

Example 11 includes the interconnect bridge of any of examples 7-10, wherein the interconnect bridge is less than 40 μm thick.

Example 12 includes a method comprising creating a first silicon layer of a interconnect bridge; applying a resist mask to the first silicon layer; removing at least some of the silicon layer not covered by the resist mask through plasma etching to create a groove in the first silicon layer, wherein a pressure level and a gas composition associated with the plasma etching have been controlled to result in a groove with a rounded bottom; filling the groove with a conductive metal; and embedding the interconnect bridge in a substrate.

Example 13 includes the method of example 12, wherein controlling the pressure level includes increasing the pressure by 40%.

Example 14 includes the method of any of examples 12-13, wherein controlling the gas composition during the plasma etching process includes reducing the long chain fluorocarbons by 80%.

Example 15 includes the method of any of examples 12-14, wherein controlling the gas composition during the plasma etching process includes adding short chain fluorocarbons into the gas composition.

Example 16 includes the method of any of examples 12-15, wherein controlling the gas composition during the plasma etching process includes reducing the oxygen component of the gas composition by 20%.

Example 17 includes the method of any of examples 12-16, wherein controlling the gas composition during the plasma etching process includes reducing inert carrier gases by 50%.

Example 18 includes the method of any of examples 12-17, wherein the interconnect bridge is ultra-thin.

Example 19 includes the method of any of examples 12-18, wherein the interconnect bridge is less than 40 µm.

Example 20 includes the method of any of examples 12-19, wherein the interconnect bridge communicatively connects a first integrated circuit die to a second integrated circuit die.

Term Usage

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A multi-die IC package, comprising:
  a substrate;
  an interconnect bridge embedded in the substrate, the interconnect bridge comprising:
    a layer comprising oxygen; and
    a metal trace in the layer comprising oxygen, the metal trace having a non-flat bottom surface, and the metal trace comprising a conductive material; and
  a first die electrically coupled to the interconnect bridge and to the substrate; and
  a second die electrically coupled to the interconnect bridge and to the substrate.

2. The multi-die IC package of claim 1, further comprising:

a second metal trace, the second metal trace below the metal trace.

3. The multi-die IC package of claim 1, wherein the interconnect bridge has a thickness of less than 100 microns.

4. The multi-die IC package of claim 3, wherein the interconnect bridge has a thickness of less than 50 microns.

5. The multi-die IC package of claim 1, wherein the metal trace electrically couples the first die to the second die.

6. The multi-die IC package of claim 1, wherein the metal trace further comprises rounded corners.

7. The multi-die IC package of claim 1, wherein the interconnect bridge is further covered by the substrate.

8. The multi-die IC package of claim 1, wherein the first die and the second die are connected to the substrate through a surface mount technology.

9. The multi-die IC package of claim 1, wherein the interconnect bridge allows communication between the first die and the second circuit die.

10. The multi-die IC package of claim 1, wherein the substrate is an organic substrate.

11. A multi-die IC package, comprising:
   a substrate;
   an interconnect bridge embedded in the substrate, the interconnect bridge comprising:
      a layer comprising oxygen;
      a groove in the layer comprising oxygen, the groove having a non-flat bottom surface; and
      a metal trace in the groove, the metal trace comprising a conductive material; and
   a first die electrically coupled to the interconnect bridge and to the substrate; and
   a second die electrically coupled to the interconnect bridge and to the substrate.

12. The multi-die IC package of claim 11, further comprising:
   a second groove, the second groove trace below the groove; and
   a second metal trace in the second groove, the second metal trace comprising the conductive material.

13. The multi-die IC package of claim 11, wherein the interconnect bridge has a thickness of less than 100 microns.

14. The multi-die IC package of claim 13, wherein the interconnect bridge has a thickness of less than 50 microns.

15. The multi-die IC package of claim 11, wherein the metal trace electrically couples the first die to the second die.

16. The multi-die IC package of claim 11, wherein the groove further comprises rounded corners.

17. The multi-die IC package of claim 11, wherein the interconnect bridge is further covered by the substrate.

18. The multi-die IC package of claim 11, wherein the first die and the second die are connected to the substrate through a surface mount technology.

19. The multi-die IC package of claim 11, wherein the interconnect bridge allows communication between the first die and the second circuit die.

20. The multi-die IC package of claim 11, wherein the substrate is an organic substrate.

* * * * *